United States Patent [15] 3,653,120

Sirrine et al. [45] Apr. 4, 1972

[54] METHOD OF MAKING LOW RESISTANCE POLYCRYSTALLINE SILICON CONTACTS TO BURIED COLLECTOR REGIONS USING REFRACTORY METAL SILICIDES

[72] Inventors: Richard C. Sirrine, Orange, Calif.; Leonard Stein, Dewitt, N.Y.

[73] Assignee: General Electric Company, Syracuse, N.Y.

[22] Filed: July 27, 1970

[21] Appl. No.: 58,521

[52] U.S. Cl. ................................29/589, 148/174, 148/175, 317/235 AT

[51] Int. Cl. ........................................B01j 17/00, H01l 7/02

[58] Field of Search .......................29/589, 576; 317/235 AT; 148/174, 175

[56] References Cited

UNITED STATES PATENTS

| | | | |
|---|---|---|---|
| 3,381,182 | 4/1968 | Thornton | 317/234 |
| 3,414,783 | 12/1968 | Moore | 317/235 |
| 3,475,661 | 10/1969 | Iwata | 317/235 AT |

FOREIGN PATENTS OR APPLICATIONS

| | | | |
|---|---|---|---|
| 1,926,884 | 12/1969 | Germany | 317/235 AT |

OTHER PUBLICATIONS

" Electronics International" Sept. 30, 1968, Vol. 41, Number 20, page 209.

*Primary Examiner*—John F. Campbell
*Assistant Examiner*—W. Tupman
*Attorney*—Robert J. Mooney, Nathan J. Cornfeld, Frank L. Neuhauser, Oscar B. Waddell, Joseph B. Forman and Carl O. Thomas

[57] ABSTRACT

This disclosure relates to a method of forming a polycrystalline silicon contact to a buried collector region of a transistor or the like. This is accomplished by providing a monocrystalline silicon substrate body having a collector region exposed at its top surface. A layer of refractory metal is subsequently formed over the entire top surface of the body. Using conventional photomasking and etching techniques a refractory metal pad is formed over a portion of the exposed surface of the collector region, and an insulating layer is formed over the top surface of the body and pad. The insulated covered body is then heated to a temperature sufficient to completely convert the refractory metal to a refractory metal silicide while simultaneously causing the metal silicide to diffuse into the collector region. The insulating layer is next completely removed using a suitable etchant. A silicon layer is subsequently epitaxially deposited onto the top surface of the entire silicon substrate body. This layer forms as a column of polycrystalline silicon material above the refractory metal silicide region, and as an epitaxial layer of monocrystalline silicon material above the rest of the top surface of the substrate body. The column of polycrystalline silicon, is subsequently treated, so that, it has the same conductivity as the collector region and together with the refractory silicide region, constitutes a vertically extending low resistance conductive path from the top surface of the completed composite body down to the collector region buried beneath the epitaxial layer, and the epitaxial layer provides a site in which are formed other functional portions of the transistor or the like, such as base and emitter portions.

4 Claims, 13 Drawing Figures

PATENTED APR 4 1972 3,653,120

Figure 1A:
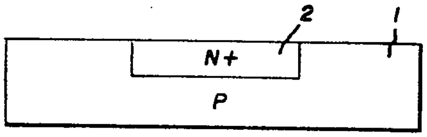
Figure 2A:
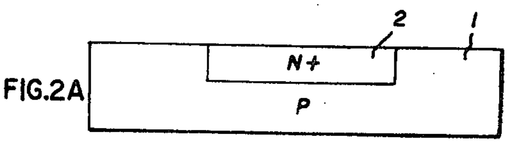

INVENTORS:
RICHARD C. SIRRINE,
LEONARD STEIN,

BY Robert J. Mooney
THEIR ATTORNEY.

METHOD OF MAKING LOW RESISTANCE POLYCRYSTALLINE SILICON CONTACTS TO BURIED COLLECTOR REGIONS USING REFRACTORY METAL SILICIDES

This invention relates to a method of making deep collector polycrystalline contacts for transistors and the like, using a refractory metal silicide as a foundation on which the polycrystalline silicon will form.

In the semiconductor prior art of manufacturing transistors and the like as portions of monolithic semiconductor integrated circuits it is conventional to form low resistivity N+ (or P+) collector regions in the surface of the silicon substrate. An epitaxial layer is subsequently formed over the top surface of the collector region, as well as over other exposed top surfaces of the substrate. A transistor comprising an emitter, base and collector region is then formed in the epitaxial layer by diffusion and photomasking techniques well known in the art.

In order to effectively use the now buried collector region formed in the original substrate, it is necessary to provide means for electrically connecting it to the external surface of the circuit. The structure, thus formed, is particularly useful in reducing the saturation resistance when the collector-base junction of the transistor is forward biased. The saturation resistance is made up of three resistance portions connected in series.

The first portion comprises the portion of the epitaxial layer directly below the collector-base junction and extends vertically to the top surface of the buried collector region. The second portion comprises the resistance generated across the horizontal length of the buried collector region between the first portion and the third portion. The third portion comprises the resistance generated by the means used to connect the buried collector region to the external surface of the circuit.

A typical method of forming this means, well known in the art, comprises the steps of: providing an insulating layer over at least part of the external surface of the circuit; forming an aperture in the insulating layer directly above the buried collector region but spaced from the emitter and base regions of the transistor; and diffusing a region of the same conductivity type material as the buried collector region down to the buried collector region through the aperture.

Unfortunately, this technique requires a long period of diffusion time (for an epi-layer of 16 microns it requires about 6 hours to make this electrical connection using phosphorous) to reach the buried collector region and, oftentimes, results in deleterious effects on the electrical characteristics of the device.

Accordingly, it is one object of this invention to reduce the manufacturing time of a monolithic integrated circuit having the foregoing characteristics by eliminating any long diffusion time processes while at the same time substantially minimizing lateral spreading of the dopant used to form the deep collector contact.

Another object of this invention is to provide a method of forming deep collector polycrystalline silicon contacts while simultaneously forming monocrystalline epitaxial silicon in such a way that it completely surrounds the polycrystalline silicon regions.

Still another object is to provide an improved method of fabricating transistors and the like having a collector region inwardly spaced from the exterior surface of the semiconductor body thereof, and having a low resistance conductive path of polycrystalline semiconductor material extending from said collector region to said exterior surface. These and other objects of this invention will be apparent from the following description and the accompanying drawing, wherein:

FIGS. 1A–1F illustrate an improved semiconductor device at various stages in the manufacture in accordance with one embodiment of the present invention; and FIGS. 2A–2G illustrate an improved semiconductor device at various stages in the manufacture in accordance with another embodiment of the present invention.

Briefly, this invention relates to a method of forming a polycrystalline silicon contact to a buried collector region. This is accomplished by providing a monocrystalline silicon body including a collector region formed in its top surface. A layer of refractory metal is then formed over the entire top surface of the body. Using conventional photomasking and etching techniques a refractory metal pad is next formed over a portion of the top surface of the collector region. Subsequently, an insulating layer is formed over the top surface of the body and the pad. The structure thus formed is then heated to a temperature sufficient to completely convert the refractory metal to its silicide thereby forming a diffused refractory metal silicide region in the top surface of the collector region. The insulating layer is next completely removed using a conventional etchant. A silicon layer is subsequently epitaxially deposited over the top surface of the silicon body whereby polycrystalline silicon material forms above the refractory metal silicide region and monocrystalline silicon material forms above the remaining portions of the top surface of the body.

Referring to FIG. 1A, a body or substrate 1 of monocrystalline semiconductor material such as silicon of one conductivity type (P in this case) is shown having a collector region 2 of opposite conductivity type (in this case N+) formed in its top surface. This is accomplished by conventional masking and diffusion techniques which are well known to those skilled in the art and are not considered part of this invention. The primary purpose of the collector region 2 is to reduce the saturation resistance of the final device, yet to be formed, by providing a more conductive path for the current to follow during the operation of the device when the base-collector junction of a subsequently formed transistor is forward biased. Another benefit of this structure is to reduce the nonsaturated resistance of the device but to a lesser degree.

Figure 1B:
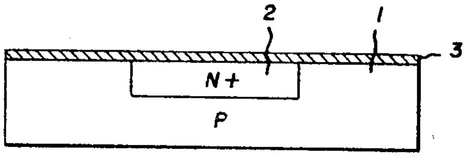
Figure 2B:
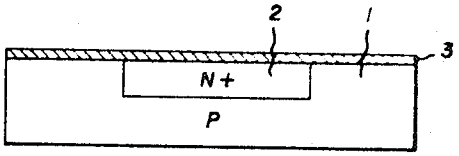
Figure 1C:
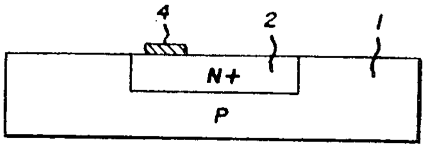
Figure 2C:
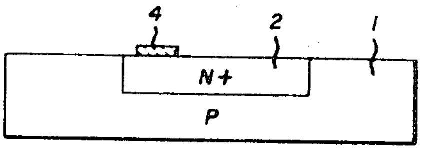

FIG. 1B shows a layer of refractory metal 3 such as tungsten, molybdenum and the like formed over the entire top surface of the silicon body 1. This can be accomplished by vapor deposition, chemical vapor deposition, sputtering or electron beam deposition of the refractory metal onto the top surface of the body 1. The thickness of the refractory metal layer 3 is preferably between 500 and 2,000 angstroms. Then using conventional photographic masking techniques and a suitable refractory metal etchant a single pad 4 of refractory metal is formed over the buried collector region 2, as shown in FIG. 1C. It is of course recognized that, if desired, more than one pad 4 may be formed and that the pad 4 may take a variety of different shapes.

Figure 1D:
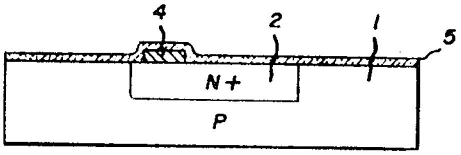
Figure 2D:
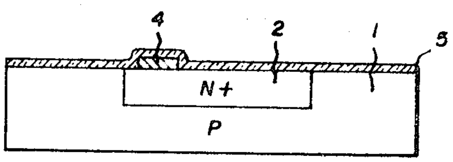

Following the formation of the pad 4 a thin layer 5 (2,000–10,000 angstroms) of insulating material such as silicon dioxide is deposited by suitable means such as a pyrolytic deposition over the entire top surface of the body. This is best shown in FIG. 1D. In the case of silicon dioxide one suitable method of accomplishing this is by the pyrolytic deposition from silane and oxygen at a temperature between 200° and 400° C. It is of course recognized that the use of other low temperature depositions such as glow discharge deposition may also be used to form the insulating layer 5.

Figure 1E:
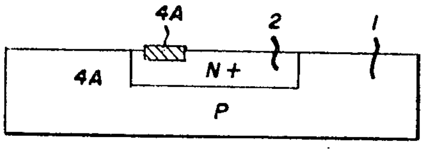

Subsequent to the formation of the insulating layer 5 the insulated covered body 1 is heated in an atmosphere such as nitrogen or hydrogen gas for a time sufficient to completely convert the refractory metal silicide. When molybdenum is used this is preferably accomplished at a temperature between 900° and 1,200° C. for 5–60 minutes to completely convert the molybdenum to a molybdenum silicide thereby forming a molybdenum silicide region 4A as shown in FIG. 1E. This later step is important because it prevents the molybdenum from laterally spreading across the top surface of the body during subsequent epitaxial deposition. The above techniques are also applicable when using other type refractory metals. After the heating step is completed the entire layer of insulating material 5 is removed using a suitable etchant such as hydrofluoric acid.

Figure 1F:
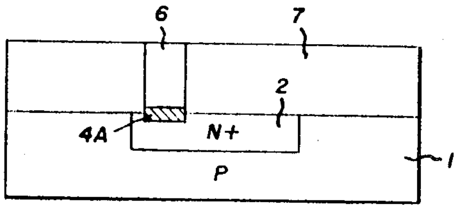

The function of the refractory metal silicide region 4A is to act as a nucleation site for subsequently forming polycrystalline silicon material 6 on top of it during a conventional epitaxial deposition step used to form monocrystalline silicon material 7 over the remaining portions of the top surface of the body 1. In addition the refractory metal silicide provides a highly conductive path for contact to the collector layer 2. This is best shown in FIG. 1F. The epitaxial deposition techniques used to form the structure shown in FIG. 1F are well known to those skilled in the art and are not part of this invention.

Upon completion of the formation of the polycrystalline silicon contact region 6 the electrical resistance of contact region 6 is reduced by diffusing into this polycrystalline region a dopant having the same conductivity type as the now buried collector region 2 (in this case N+). This is accomplished by forming an insulating layer over the top surface, opening apertures in the insulating layer to exposed portions of the polycrystalline region 6, depositing a dopant of desired concentration in the aperture and then diffusing the dopant for a time sufficient for the dopant to reach the refractory metal silicide region 4A. It's also possible that this diffusion step be done simultaneously with the formation of an N+ emitter for an NPN transistor not shown in FIG. 1F because impurity (such as phosphorous) diffusion proceeds faster in polycrystalline silicon material than in monocrystalline silicon material. It is also recognized that when it is desirable to make a deep collector contact to be buried P+ collector region the same technique as above could be used, except a P+ impurity such as boron would be substituted where an N+ impurity was specified.

Figure 2E:
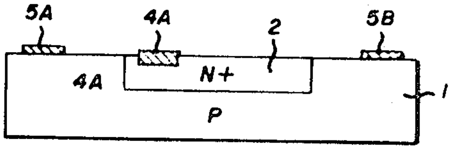
Figure 2F:
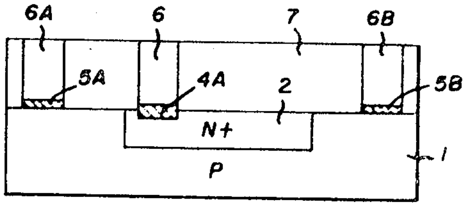

Another embodiment of this invention is shown in FIGS. 2A–2G. This embodiment is one in which device isolation is simultaneously provided at the same time the polycrystalline contact is provided to the collector region 2. The structures shown in FIGS. 2A–2D are formed in the same manner as those shown in FIGS. 1A–1D. At this point, after the refractory metal is heated to convert it to a refractory metal silicide and it diffuses into the buried collector region 2 to form pad 4A, the insulating layer is not completely removed but patterned by conventional photomasking techniques well known in the art, to form two insulating pads 5A and 5B, as shown in FIG. 2E. Thus pads 4A, 5A and 5B will subsequently simultaneously act as nucleation sites for forming the polycrystalline silicon columns 6, 6A and 6B shown in FIG. 2F. This is accomplished by epitaxially depositing a silicon layer onto the top surface of the silicon body 1. At the same time columns 6, 6A and 6B are forming, monocrystalline silicon 7 is also forming above those portions of the top surface of the structure not covered by pads 4A, 5A and 5B, as shown in FIG. 2F. Thus polycrystalline columns 6A and 6B act together to provide device isolation from other devices that may be formed in the silicon body 1, while polycrystalline column 6 makes contact with the now buried collector region 2. Device isolation is further enhanced via a P+ diffusion from the top of the structure through the polycrystalline columns 6A and 6B to the insulating pads 5A and 5B by techniques well known in the art. It is also possible that this diffusion step be done simultaneously with the formation of a P+ base for an NPN transistor.

Figure 2G:
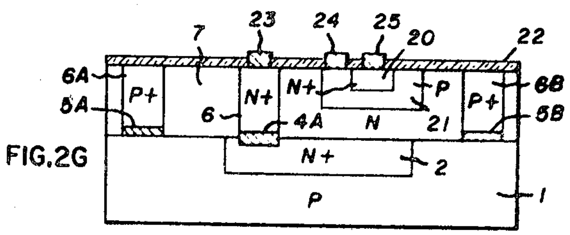

Upon completion of the structure shown in FIG. 2F subsequent processing steps can be used to further modify the structure as shown in FIG. 2G. Using conventional masking, etching and diffusion steps well known to those skilled in the art the P+ regions 6A, 21 and 6B are formed as well as N+ regions 6 and 20. Once these regions are formed contacts It will be appreciated by those skilled in the art that this invention may be carried out in various ways and may take various forms and embodiments other than the illustrative embodiments heretofore described. Accordingly, it is to be understood that the scope of this invention is not limited by the details of the foregoing description, but will be defined in the following claims.

What I claim as new and desire to secure by Letters Patent of the United States is:

1. An improved method of forming a low resistance conductive path from an external surface of a transistor to collector region spaced inwardly from said surface making deep collector contacts comprising the steps of:

providing a monocrystalline semiconductor substrate body having in its top surface a collector region of opposite conductivity than the body;

depositing a layer of refractory metal over the top surface of the body;

masking and etching the refractory metal so that a contact pad of refractory metal remains contiguous with the top surface of the collector region;

depositing an insulating layer over the entire top surface of the body;

heating the insulated covered refractory metal for a time sufficient to completely convert the refractory metal to a refractory metal silicide while simultaneously diffusing it into the collector region;

removing the insulating layer from the top surface of the body; and epitaxially depositing a semiconductor material onto the body whereby a polycrystalline semiconductor material forms over the top surface of the refractory metal silicide contact pad and a monocrystalline semiconductor material forms over the remaining portions of the top surface.

2. An improved method of making deep collector contacts as defined in claim 1, wherein after the steps in claim 1 are completed the following steps are added:

forming a second insulating layer over the top surface of the newly deposited polycrystalline and monocrystalline semiconductor material;

forming a second set of apertures in the second insulating layer thereby exposing a portion of the top surface of the newly formed polycrystalline semiconductor material;

depositing the same conductivity type dopant, as that of the now buried collector, into the second set of apertures and diffusing it into said polycrystalline material for a time sufficient to reach the buried collector region thus connecting it to the external surface of the body.

3. An improved method of simultaneously making a deep collector contact and providing device isolation for a monolithic integrated circuit comprising the steps of:

providing a silicon body of one conductivity type having a collector region of opposite conductivity type than the body formed on its top surface;

depositing a layer of refractory metal over the top surface of the body;

masking and etching the refractory metal so that a contact pad of refractory metal remains contiguous with the top surface of the collector region;

depositing a first insulating layer over the entire top surface of the body;

heating the insulated covered refractory metal for a time sufficient to completely convert the refractory metal to a refractory metal silicide while simultaneously diffusing it into the collector region;

masking and etching the insulating layer to form isolation nucleation pads in desired locations for the subsequent formation of polycrystalline silicon columns, while at the same time removing the insulating layer from the remaining portions of the top surface of the body; and epitaxially depositing silicon onto the silicon body whereby a polycrystalline silicon material forms over the top surface of the refractory metal silicide contact pad and the isolation nucleation pads and a monocrystalline silicon material forms over the remaining portions of the top surface.

4. An improved method of forming a low resistance conductive path from an external surface of a transistor to a collector region spaced inwardly from said external surface comprising the steps of:

forming, in a monocrystalline semiconductor substrate body having a top surface, a collector region exposed at said top surface;

forming with the exposed surface portion of said collector region a compound of a refractory metal and the semiconductor material constituting said collector region;

epitaxially depositing an additional layer of said semiconductor material onto the top surface of said substrate body and forming thereby a column of polycrystalline material above the refractory metal compound with said polycrystalline column being surrounded by an epitaxial layer of monocrystalline semiconductor material covering the remainder of the top surface of said body;

forming transistor base and emitter portions in the site constituted by said epitaxial monocrystalline layer; and establishing a low resistance contact to said collector region through said column.

* * * * *